United States Patent
Wang

(10) Patent No.: US 10,522,724 B2
(45) Date of Patent: *Dec. 31, 2019

(54) LED PACKAGING MATERIAL AND MANUFACTURING METHOD OF THE SAME

(71) Applicant: Shenzhen China Star Optoelectronics Technology Co., Ltd, Shenzhen, Guangdong (CN)

(72) Inventor: Haijun Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/425,976

(22) Filed: May 30, 2019

(65) Prior Publication Data

US 2019/0280173 A1 Sep. 12, 2019

Related U.S. Application Data

(63) Continuation of application No. 15/737,159, filed on Dec. 15, 2017.

(51) Int. Cl.
| | | |
|---|---|---|
| *H01L 33/00* | (2010.01) | |
| *H01L 33/56* | (2010.01) | |
| *H01L 33/48* | (2010.01) | |
| *C08K 3/04* | (2006.01) | |
| *C08K 9/04* | (2006.01) | |
| *C08L 101/00* | (2006.01) | |

(52) U.S. Cl.
CPC ............. *H01L 33/56* (2013.01); *C08K 3/04* (2013.01); *C08K 9/04* (2013.01); *C08L 101/00* (2013.01); *H01L 33/005* (2013.01); *H01L 33/483* (2013.01); *C08L 2201/08* (2013.01); *C08L 2203/206* (2013.01)

(58) Field of Classification Search
None
See application file for complete search history.

(56) References Cited

FOREIGN PATENT DOCUMENTS

| | | |
|---|---|---|
| CN | 102102001 A | 6/2011 |
| CN | 102382606 A | 3/2012 |
| CN | 103396653 A | 11/2013 |
| CN | 103408895 A | 11/2013 |
| CN | 104530708 A | 4/2015 |
| CN | 104610706 A | 5/2015 |
| CN | 105062082 A | 11/2015 |
| CN | 105255120 A | 1/2016 |
| CN | 106449952 A | 2/2017 |

*Primary Examiner* — Calvin Y Choi
(74) *Attorney, Agent, or Firm* — Andrew C. Cheng

(57) ABSTRACT

A light-emitting diode (LED) packaging material is formed by compounding graphene with silane or epoxy resin, to improve the defects of manufacturing an LED packaging material only of silane or epoxy resin. The addition of graphene helps improve the performance of the LED packaging material. Also provided is a manufacturing method of a LED packaging material.

2 Claims, 2 Drawing Sheets

LED PACKAGING MATERIAL AND MANUFACTURING METHOD OF THE SAME

This is a continuation application of copending U.S. patent application Ser. No. 15/737,159 filed on Dec. 15, 2017, which is a national stage of PCT Application No. PCT/CN2017/087821, filed on Jun. 9, 2017, claiming foreign priority of Chinese Patent Application No. 201710334882.9 filed on May 12, 2017, entitled "LED Packaging Material and Manufacturing Method of the same", which is incorporated by reference in its entirety.

BACKGROUND OF THE INVENTION

Field of Invention

The present invention relates to a light-emitting diode (LED) packaging material, and more particularly to a LED packaging material with graphene and a manufacturing method of the same.

Description of Prior Art

LED is constituted of chips, metal wires, brackets, conductive plastic, packaging materials, and etc., and the main function of the packaging material is to seal for preventing the chips from affecting by humidity, temperature, and oxidation, to reduce the efficiency, thus protecting the normal operation of the chips. In addition, the packaging material also has the following functions: fix electronic devices to avoid changes of the device parameters on the electronic devices due to impact of mechanical vibration and etc.; reduce the refractive index between LED chips and air to improve light emission efficiency; and play a cooling function for the LED chips. Therefore, the LED packaging material not only has a better sealing, a high transmittance, but also has a better bonding strength. The conventional LED packaging materials are mainly an epoxy resin, a silicone and other materials. Among them, the epoxy resin is for its excellent adhesion, electrical insulation, sealing and dielectric properties and the cost is relatively low, easy to shape and other characteristics to become a mainstream material of a LED packaging. The silicone material has a good transparency, a high temperature resistance, weather resistance, insulation and strong hydrophobic, which all make the silicone material be the ideal choice for the LED packaging material.

However, there are technical defects when using the above two kinds of materials for LED packaging materials: the epoxy resin itself has hygroscopicity, easy aging, poor heat resistance, and being easily to change color under high temperature and short-wave light, large internal stress while curing and other shortcomings, these adverse factors will greatly affect and shorten the service life of a LED devices; and the silicone material itself does not have strong mechanical strength and high thermal expansion. Obviously, the conventional LED packaging materials, while applying these two materials for manufacture, these adverse factors will have a more serious impact on the performance of a LED packaging materials.

SUMMARY OF THE INVENTION

An embodiment of the present invention provides a new light-emitting diode (LED) packaging material, which is formed by compounding the graphene with the silane or the epoxy resin, to improve the defects of manufacturing the LED packaging material of the single silane or the epoxy resin, with the help of the properties of graphene, so as to improve the performance of the LED packaging material.

In the first aspect, the present invention provides a LED packaging material of a first embodiment, the LED packaging material comprises following raw materials in percentage by weight: a curing agent is 10%-40%, a graphene is 0.05%-1%, an epoxy resin is 40%-60%, and an accelerating agent is 0.5%-2%.

The curing agent is selected from the group consisting of one or more of methyltetrahydrophthalic anhydride, divinyltriamine, aminoethylpiperazine, 1,2-diaminocyclohexane, tetraethylenepentamine, bis methylaminopropylamine, dihexyltriamine, methylenebis-phenylenediamine.

The graphene adds hydroxyl groups and/or carboxyl groups to a surface of the graphene by a surface modification.

The accelerating agent is for promoting mutual dispersion among the raw materials or for promoting mutual dissolution among the raw materials and for promoting the mixing between the graphene and the epoxy resin.

In the second aspect, the present invention provides a manufacturing method of a LED packaging material of a first embodiment, which comprises:

a curing agent and a graphene with preset doses are provided, and the curing agent and graphene are fully mixed.

An epoxy resin and an accelerating agent with preset doses are provided, and added into a mixed solution of the graphene and the curing agent.

The mixed solution of the graphene and the curing agent are fully mixed by ultrasonic to form the LED packaging material formed by compounding the graphene and the epoxy resin.

The curing agent is selected from the group consisting of one or more of methyltetrahydrophthalic anhydride, divinyltriamine, aminoethylpiperazine, 1,2-diaminocyclohexane, tetraethylenepentamine, bis methylaminopropylamine, dihexyltriamine, methylenebis-phenylenediamine. The graphene adds hydroxyl groups and/or carboxyl groups to a surface of the graphene by a surface modification. The accelerating agent is for promoting mutual dispersion among the raw materials or for promoting mutual dissolution among the raw materials and for promoting the mixing between the graphene and the epoxy resin.

In the mixed solution constituted of the curing agent, the graphene, the epoxy resin and the accelerating agent. A weight percentage of each component is as follows: the curing agent is 10%-40%, the graphene is 0.05%-1%, the epoxy resin is 40%-60%, and the accelerating agent is 0.5%-2%.

An operation method for the step of fully mixing the mixed solution of the graphene and the curing agent is as follows: an ultrasonic disperser is used to perform an ultrasonic process to a mixture of the curing agent and the graphene. A power of the ultrasonic 500 W-900 W and a duration is 3-5 hours.

Before the step of fully mixing the mixed solution of the graphene and the curing agent by ultrasonic, the manufacturing method further comprises: the mixed solution of the graphene and the curing agent are stirred by a glass rod, so that the components in the mixed solution are uniformly distributed.

After the step of fully mixing the mixed solution of the graphene and the curing agent by ultrasonic, the manufacturing method further comprises: the mixed solution fully mixed by ultrasonic is placed in a vacuum oven and is baked at 60-80° C. for 1 hour, to remove air bubbles in the mixed solution.

In the third aspect, the present invention provides a LED packaging material of a second embodiment, the LED packaging material is manufactured by a silane, a control agent, a basic ion exchange resins, and a graphene. A mass percentage of the basic ion exchange resin is 5%-10%. A mass percentage of the graphene is 0.5%-2%. A molar ratio of the silane and the control agent is 1:0.3-1:1.

The control agent comprises terminal hydroxyl groups; and the basic ion exchange resin is a basic anion exchange resin or a basic cation exchange resin.

In the fourth aspect, the present invention provides a manufacturing method of a LED packaging material of a second embodiment, which comprises:

a silane, a control agent, a basic ion exchange resin and a graphene with preset doses are mixed and heated, to form a packaging material sample.

Impurities in the packaging material sample are removed, to obtain the LED packaging material.

In the step of mixing and heating a silane, a control agent, a basic ion exchange resin and a graphene with preset doses, a heating temperature is 30-80° C. and a heating duration is 5-20 hours.

The impurities in the packaging material sample comprises a residual the basic ion exchange resin left by insufficient reaction, and the residual basic ion exchange resin can be removed by filtration.

The impurities in the packaging material sample further comprise a low boiling point solvent, and the low boiling point solvent can be removed by depressurization.

A mass percentage of the ion exchange resin is 5%-10%. A mass percentage of the graphene is 0.5%-2%. A molar ratio of the silane and the control agent is 1:0.3-1:1. The control agent comprises terminal hydroxyl groups. The basic ion exchange resin is a basic anion exchange resin or a basic cation exchange resin.

The LED packaging material provided by the embodiment of the present invention is formed by compounding the graphene with the silane or the epoxy resin, to improve the defects of manufacturing the LED packaging material of the single silane or the epoxy resin, with the help of the properties of graphene, so as to improve the performance of the LED packaging material.

BRIEF DESCRIPTION OF THE DRAWINGS

In order to describe the technical solutions in the embodiments of the present invention or in the conventional art more clearly, the accompanying drawings required for describing the embodiments or the conventional art are briefly introduced. Apparently, the accompanying drawings in the following description only show some embodiments of the present invention. For those skilled in the art, other drawings may be obtained based on these drawings without any creative work.

DETAILED DESCRIPTION OF THE PREFERRED EMBODIMENTS

Figure 1:
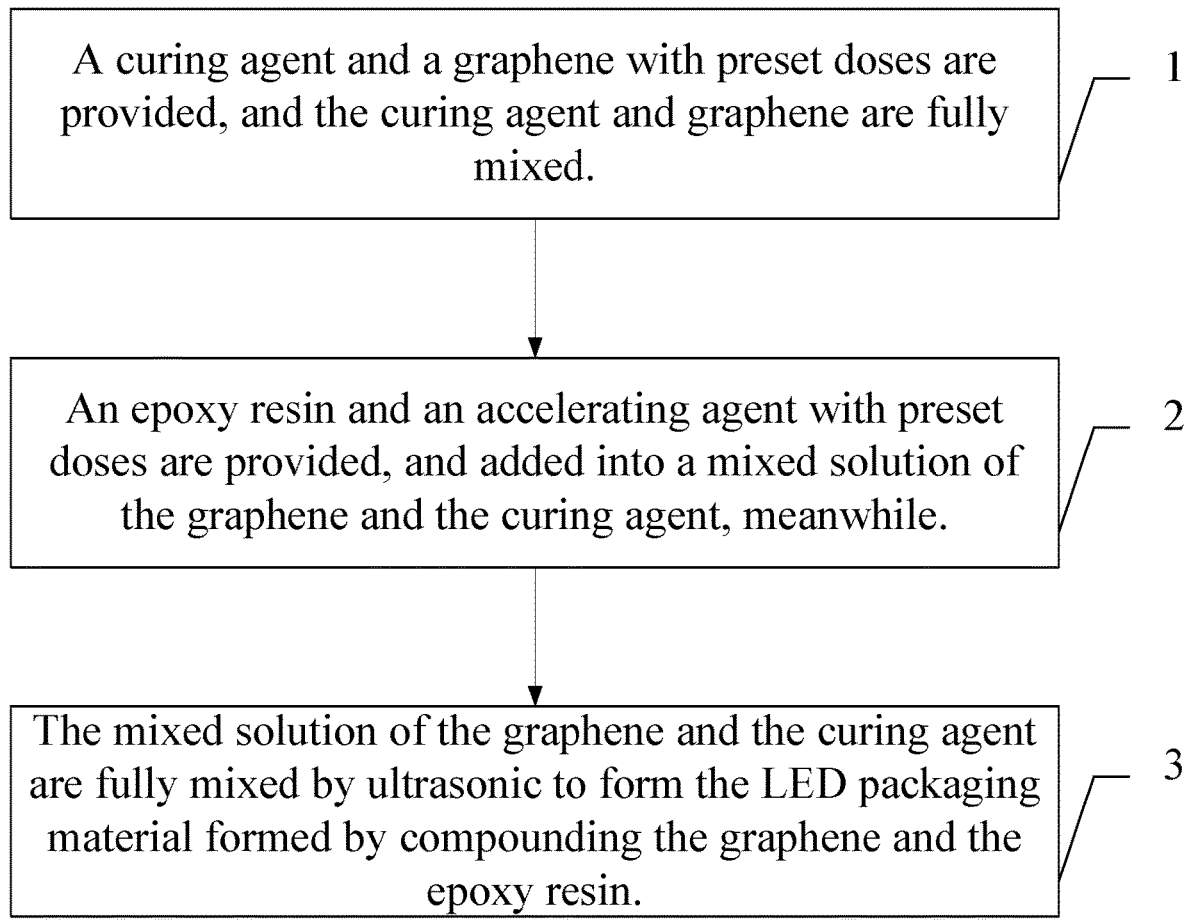
FIG. 1 is a flow chart of a manufacturing method of the LED packaging material of a first embodiment according to the present invention.

The technical solutions in the embodiments of the present invention are clearly and completely described below with reference to the accompanying drawings in the embodiments of the present invention. Obviously, the described embodiments are only some embodiments of the present invention, rather than all of the embodiments. All other embodiments obtained by persons of ordinary skill in the art based on the embodiments of the present invention without creative efforts shall fall within the protection scope of the present invention.

In addition, the following description of the embodiments is given with reference to the appended drawings, for the purpose of illustrating certain embodiments in which the invention may be practiced. Directional terms such as "up", "down", "front", "back", "left", "right", "inside", "outside", "side" are used to refer to the attached drawings. Therefore, the directional terms are used for better and more clearly illustrating and understanding the present invention, rather than indicating or implying that the device or element must have a specific orientation, manufactured and operated by a specific orientation, and thus could not be understood as a limitation of the present invention.

In the description of the present invention, it should be noted that the terms "mounted," "connected," and "connected" should be broadly understood unless the context clearly indicates. For example, may be a fixed connection, a removable connection, an integral connection, a mechanical connection, a direct connection, and an indirectly connection through an intermediary, an internal communication between the two elements. For those skilled in the art, the specific meanings of the above terms in the present invention may be understood based on specific cases.

In addition, in the description of the present invention, unless with special description, the meaning of "plural" is two or more. When the term "process" appears in the present specification, the term "process" is used to mean not only an independent process, but also an expected effect that can be expected from the process unless clearly distinguished from other processes. The numerical range denoted by "-" in the present specification means a range including the numerical values described before and after "-" as the minimum value and the maximum value, respectively. In the drawings, elements that are similar in structure or the same are denoted by the same reference numerals.

The present invention provides a light-emitting diode (LED) packaging material and the manufacturing method of the same, the LED packaging material is formed by compounding the graphene with the silane or the epoxy resin, to improve the defects of manufacturing the LED packaging material of the single silane or the epoxy resin, with the help of the properties of graphene, so as to improve the performance of the LED packaging material. A detailed description is as below.

In a LED packaging material of a first embodiment of the present invention, the LED packaging material comprises following raw materials in percentage by weight: a curing agent is 10%-40%, a graphene is 0.05%-1%, an epoxy resin is 40%-60%, and an accelerating agent is 0.5%-2%.

In the embodiment, the curing agent is selected from the group consisting of one or more of methyltetrahydrophthalic anhydride, divinyltriamine, aminoethylpiperazine, 1,2-diaminocyclohexane, tetraethylenepentamine, bis methylaminopropylamine, dihexyltriamine, methylenebis-phenylenediamine.

In the embodiment, the graphene adds hydroxyl groups and/or carboxyl groups to a surface of the graphene by a surface modification.

In the embodiment, the accelerating agent is for promoting mutual dispersion among the raw materials or for promoting mutual dissolution among the raw materials and for promoting the mixing between the graphene and the epoxy resin. The type of the accelerating agent is not specifically limited in the present invention as long as it is possible to accelerate sufficient mixing between the graphene and the epoxy resin.

The LED packaging material provided by the embodiment uses the curing agent and accelerating agent to accelerate for compounding the graphene and the epoxy resin to form the LED packaging material, to overcome the problem of hygroscopicity, easy aging, poor heat resistance, and being easily to change color under high temperature and short-wave light, large internal stress while curing and etc., making the thermal conductivity, environmental stability, mechanical properties, thermal stability and so on of the LED packaging material highly raised.

Please refer to FIG. 1, which is a flow chart of a manufacturing method of the LED packaging material of a first embodiment according to the present invention. In the embodiment, the manufacturing method of the LED packaging material comprises at least below steps:

Step 1, a curing agent and a graphene with preset doses are provided, and the curing agent and graphene are fully mixed.

In an embodiment of the present invention, the graphene is in a powder form, so as to facilitate thorough mixing with the curing agent. In addition, the graphene may be surface-modified before being mixed with the curing agent and groups such as hydroxyl groups and/or carboxyl groups may be added to the surface of the graphene so as to improve the performance of the graphene.

In one embodiment of the present invention, the curing agent is selected from the group consisting of one or more of methyltetrahydrophthalic anhydride, divinyltriamine, aminoethylpiperazine, 1,2-diaminocyclohexane, tetraethylenepentamine, bis methylaminopropylamine, dihexyltriamine, methylenebis-phenylenediamine and so on. The type of the curing agent is not specifically defined herein.

In one embodiment of the present invention, an operation method for the step of fully mixing the mixed solution of the graphene and the curing agent is as follows: an ultrasonic disperser is used to perform an ultrasonic process to a mixture of the curing agent and the graphene. A power of the ultrasonic 500 W-900 W and a duration is 3-5 hours.

Step 2, an epoxy resin and an accelerating agent with preset doses are provided, and added into a mixed solution of the graphene and the curing agent, meanwhile, the mixed solution comprises the curing agent, the graphene, the epoxy resin, and the accelerating agent.

In one embodiment of the present invention, the epoxy resin is the same as the epoxy resin commonly used in the conventional LED packaging materials and will not be described in detail herein.

In one embodiment of the present invention, the accelerating agent is for promoting mutual dispersion among the raw materials or for promoting mutual dissolution among the raw materials and for promoting the mixing between the graphene and the epoxy resin. The type of the accelerating agent is not specifically limited in the present invention as long as it is possible to accelerate sufficient mixing between the graphene and the epoxy resin.

In one embodiment of the present invention, in the mixed solution constituted of the curing agent, the graphene, the epoxy resin and the accelerating agent, a weight percentage of each component is as follows: the curing agent is 10%-40%, the graphene is 0.05%-1%, the epoxy resin is 40%-60%, and the accelerating agent is 0.5%-2%.

Step 3, the mixed solution of the graphene and the curing agent are fully mixed by ultrasonic to form the LED packaging material formed by compounding the graphene and the epoxy resin.

In one embodiment of the present invention, before the step of fully mixing the mixed solution of the graphene and the curing agent by ultrasonic, the manufacturing method further comprises: the mixed solution of the graphene and the curing agent are stirred by a glass rod, so that the components in the mixed solution are uniformly distributed. After the components in the mixed solution are uniformly stirred by the glass rod, the components are sufficiently mixed by the ultrasonic method. In one embodiment of the present invention, the duration of the stirring by the glass rod is 20 minutes and the duration of mixing by ultrasonic usually takes 1 hour.

In one embodiment of the present invention, after the step of fully mixing the mixed solution of the graphene and the curing agent by ultrasonic, the manufacturing method further comprises: the mixed solution fully mixed by ultrasonic is placed in a vacuum oven and is baked at 60-80° C. for 1 hour, to remove air bubbles in the mixed solution. After the LED packaging material is formed by the mixed solution of the graphene and the curing agent, the residual low-boiling-point solvent is volatilized into a gaseous state to form the bubbles. Therefore, the gaseous state solvent which is volatilized (the bubbles) can be removed; the bubbles in the mixed solution can be excluded.

The manufacturing method of the LED packaging material of the embodiment use the ultrasonic method to fully mix the curing agent, the accelerating agent, the graphene, and the epoxy resin, to overcome the problem of hygroscopicity, easy aging, poor heat resistance, and being easily to change color under high temperature and short-wave light, large internal stress while curing and etc., making the thermal conductivity, environmental stability, mechanical properties, thermal stability and so on of the LED packaging material highly raised.

In the LED packaging material of the second embodiment of the present invention, the LED packaging material is manufactured by a silane, a control agent, a basic ion exchange resins, and a graphene. A mass percentage of the basic ion exchange resin is 5%-10%, a mass percentage of the graphene is 0.5%-2%, a molar ratio of the silane, and the control agent is 1:0.3-1:1.

In the embodiment of the present invention, the type of the silane can be methyltrichlorosilane, dimethyldichlorosilane, phenyl trichlorosilane, diphenyl dichlorosilane and other organic silicon monomer, but also other groups substituted silicone monomer, Such as alkoxysilanes and the like. In the embodiment of the present invention, the type of the silane is not specifically limited.

In an embodiment of the present invention, the specific type of the control agent is not limited as long as it has a terminal hydroxyl group, for example, a terminal hydroxyl-terminated polydimethylsiloxane and the like.

In an embodiment of the present invention, the specific type of the basic ion exchange resin is not limited, and may be a basic anion exchange resin or a basic cation exchange resin.

The LED packaging material provided by the embodiment uses the control agent and the basic ion exchange resin to accelerate compounding the graphene and the silane, to form the LED packaging material, to overcome the adverse factors such as low weak mechanical strength, high thermal expansion and so on, existed while forming the LED packaging material with only silane, as the LED packaging material, these adverse factors will become a more serious problem. Hence, the LED packaging material of the present invention uses the control agent and the basic ion exchange resin to accelerate compounding the graphene and the silane, to form the LED packaging material, making the thermal conductivity, environmental stability, mechanical properties, and thermal stability and so on of the LED packaging material highly raised.

Figure 2:
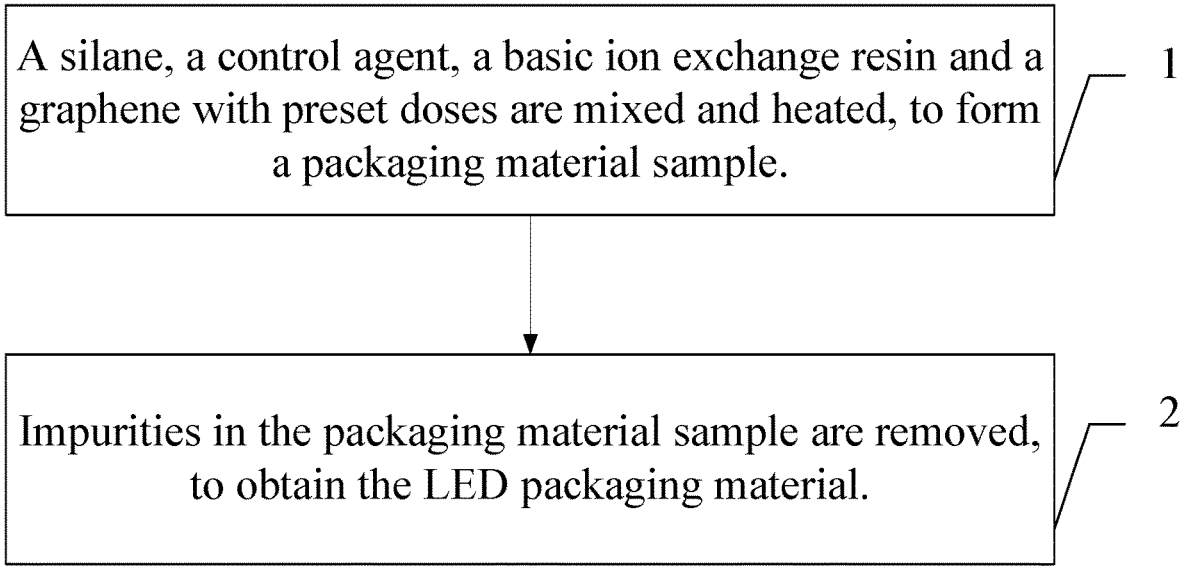
FIG. 2 is a flow chart of a manufacturing method of the LED packaging material of a second embodiment according to the present invention.

Please refer to FIG. 2, which is a flow chart of a manufacturing method of the LED packaging material of a second embodiment according to the present invention, which can manufacture the LED packaging material of the second embodiment. In the embodiment, the manufacturing method of the LED packaging material comprises at least below steps:

Step 21, a silane, a control agent, a basic ion exchange resin and a graphene with preset doses are mixed and heated, to form a packaging material sample.

In the embodiment of the present invention, the type of the silane can be methyltrichlorosilane, dimethyldichlorosilane, phenyl trichlorosilane, diphenyl dichlorosilane and other organic silicon monomer, but also other groups substituted silicone monomer, such as alkoxysilanes and the like. In the embodiment of the present invention, the type of the silane is not specifically limited.

In an embodiment of the present invention, the specific type of the control agent is not limited as long as it has a terminal hydroxyl group, for example, a terminal hydroxyl-terminated polydimethylsiloxane and the like.

In an embodiment of the present invention, a mass percentage of the basic ion exchange resin is 5%-10%, a mass percentage of the graphene is 0.5%-2%, and a molar ratio of the silane and the control agent is 1:0.3-1:1.

In an embodiment of the present invention, in the step of mixing and heating a silane, a control agent, a basic ion exchange resin and a graphene with preset doses, a heating temperature is 30-80° C. and a heating duration is 5-20 hours, to form the packaging material sample.

Step 22, impurities in the packaging material sample are removed, to obtain the LED packaging material.

In an embodiment of the present invention, the impurities in the packaging material sample comprises a residual the basic ion exchange resin left by insufficient reaction, and hence, the residual basic ion exchange resin can be removed by filtration.

In an embodiment of the present invention, the impurities in the packaging material sample further comprises a low boiling point solvent, such as alkaline ion exchange resin solvent, hence, the low boiling point solvent can be removed by depressurization. The principle is as follows: the low boiling point of the encapsulating material sample is easily volatilized into a gaseous state, and then the solvent with a low boiling point can be removed by depressurizing it, to remove the low boiling point solvent.

It can be understood that, when the impurities in the sample of the packaging material sample include both the residual basic ion exchange resin left by insufficient reaction and the low boiling point solvent as described above, the two impurities may be sequentially removed by filtration and depressurization.

The manufacturing method of a LED packaging material of the embodiment uses the basic ion exchange resin and the control agent to accelerate compounding the graphene and the silane, to form the LED packaging material, to overcome the problem of low weak mechanical strength, high thermal expansion and so on, existed while forming the LED packaging material with only silane, hence, making the thermal conductivity, environmental stability, mechanical properties, thermal stability and so on of the LED packaging material highly raised.

In the description of the present specification, the description with reference to the terms "one embodiment," "some embodiments," "an example," "a specific example," "some examples," and the like means a particular feature described in connection with the embodiment or example. The structures, materials, or characteristics are included in at least one embodiment or example of the present invention. In this specification, the schematic representation of the above terms does not necessarily refer to the same embodiment or example. Furthermore, the particular features, structures, materials, or characteristics described may be combined in any suitable manner in any one or more embodiments or examples.

The LED packaging material and the liquid crystal display panel provided by the embodiments of the present disclosure are described in detail above. Specific examples are used herein to describe the principle and implementation manners of the present disclosure. The description of the above embodiments is merely used to help understand the present disclosure and its core concept; meanwhile, those skilled in the art may make changes to the specific implementing manners and the application scope according to the concept of the present invention. In view of the above, the contents of the description should not be construed as limitations of the invention.

What is claimed is:

1. A light-emitting diode (LED) packaging material, comprising silane, a control agent, a basic ion exchange resin, and graphene, wherein a mass percentage of the basic ion exchange resin is 5%-10%; a mass percentage of graphene is 0.5%-2%; and a molar ratio of silane and the control agent is 1:0.3-1:1.

2. The LED packaging material according to claim 1, wherein the control agent comprises terminal hydroxyl groups; and the basic ion exchange resin is a basic anion exchange resin or a basic cation exchange resin.

* * * * *